(12) United States Patent
Chou et al.

(10) Patent No.: US 12,315,827 B2
(45) Date of Patent: May 27, 2025

(54) SEMICONDUCTOR STRUCTURE INCLUDING SEAL RING STRUCTURE

(71) Applicant: United Microelectronics Corp., Hsinchu (TW)

(72) Inventors: Hui-Lung Chou, Kaohsiung (TW); Ching-Li Yang, Pingtung County (TW); Chih-Sheng Chang, Tainan (TW); Chien-Ting Lin, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 405 days.

(21) Appl. No.: 17/735,099

(22) Filed: May 2, 2022

(65) Prior Publication Data
US 2023/0326882 A1   Oct. 12, 2023

(30) Foreign Application Priority Data
Apr. 11, 2022 (CN) .......................... 202210375520.5

(51) Int. Cl.
*H01L 23/58* (2006.01)
*H01L 23/00* (2006.01)

(52) U.S. Cl.
CPC .......... *H01L 23/564* (2013.01); *H01L 23/562* (2013.01); *H01L 23/585* (2013.01)

(58) Field of Classification Search
CPC ... H01L 23/564; H01L 23/562; H01L 23/585; H01L 23/3171; H01L 23/3192; H01L 23/5283
See application file for complete search history.

(56) References Cited

U.S. PATENT DOCUMENTS

| 6,566,736 B1 * | 5/2003 | Ogawa | H01L 23/485 257/629 |
| 8,164,163 B2 * | 4/2012 | Takemura | H01L 23/585 257/E23.194 |
| 9,627,332 B1 * | 4/2017 | Liang | H01L 23/585 |
| 11,004,805 B2 * | 5/2021 | Tsai | H01L 23/562 |

(Continued)

FOREIGN PATENT DOCUMENTS

TW        202103241        1/2021

OTHER PUBLICATIONS

"Office Action of Taiwan Counterpart Application", issued on Feb. 18, 2025, p. 1-p. 5.

*Primary Examiner* — Ida M Soward
(74) *Attorney, Agent, or Firm* — JCIPRNET (57) ABSTRACT

A semiconductor structure includes a substrate, a first dielectric layer on the substrate, a second dielectric layer on the first dielectric layer, a seal ring structure including first and second interconnect structures, and a passivation layer on the seal ring structure and the second dielectric layer. The first interconnect structure is located in the first dielectric layer. The second interconnect structure is located in the second dielectric layer and connected to the first interconnect structure. The passivation layer has a spacer portion covering a sidewall of the second dielectric layer and a portion of the first dielectric layer. A ditch exists in the passivation layer and the first dielectric layer. The spacer portion is located between the ditch and the seal ring structure. The semiconductor structure is able to reduce time and power of an etching process for forming the ditch.

10 Claims, 5 Drawing Sheets

(56) References Cited

U.S. PATENT DOCUMENTS

| | | | |
|---|---|---|---|
| 2007/0158788 A1* | 7/2007 | Yang | H01L 23/585 |
| | | | 257/E23.134 |
| 2009/0008783 A1* | 1/2009 | Saigoh | H10B 53/40 |
| | | | 257/760 |
| 2009/0115024 A1* | 5/2009 | Jeng | H01L 23/562 |
| | | | 257/E23.141 |
| 2010/0078769 A1* | 4/2010 | West | H01L 23/562 |
| | | | 257/E23.179 |
| 2011/0309465 A1* | 12/2011 | Chen | H01L 23/585 |
| | | | 257/503 |
| 2014/0239455 A1* | 8/2014 | Ishii | H01L 23/562 |
| | | | 257/622 |
| 2023/0036280 A1* | 2/2023 | Lai | H01L 23/562 |

\* cited by examiner

SEMICONDUCTOR STRUCTURE INCLUDING SEAL RING STRUCTURE

CROSS-REFERENCE TO RELATED APPLICATION

This application claims the priority benefit of China patent application serial no. 202210375520.5, filed on Apr. 11, 2022. The entirety of the above-mentioned patent application is hereby incorporated by reference herein and made a part of this specification.

BACKGROUND

Technical Field

The disclosure relates to a semiconductor structure and a manufacturing method thereof; more particularly, the disclosure relates to a semiconductor structure with a ditch and a manufacturing method thereof.

Description of Related Art

The existing semiconductor structure may produce metal burr when a laser grooving process is being performed, and the metal burr may lead to unnecessary short circuit during a packaging process, thus resulting in a decrease in the product yield.

The solution to the above issue at present is to form a ditch in the semiconductor structure, whereby the metal burr falls into the ditch to prevent the unnecessary short circuit caused by the metal burr during the packaging process. Since the ditch has a relatively large depth, an etching process for forming the ditch requires a relatively long period of time. To shorten the time of the etching process for forming the ditch, the power of the etching process should be increased. However, the high-power etching process may bring about a negative impact on electrical properties of semiconductor devices.

SUMMARY

The disclosure provides a semiconductor structure and a manufacturing method thereof which may reduce time and power of an etching process for forming a ditch.

In an embodiment of the disclosure, a semiconductor structure includes a substrate, a first dielectric layer, a second dielectric layer, a seal ring structure, and a passivation layer. The first dielectric layer is located on the substrate. The second dielectric layer is located on the first dielectric layer. The seal ring structure includes a first interconnect structure and a second interconnect structure. The first interconnect structure is located in the first dielectric layer. The second interconnect structure is located in the second dielectric layer and connected to the first interconnect structure. The passivation layer is located on the seal ring structure and the second dielectric layer. The passivation layer has a spacer portion. The spacer portion covers a sidewall of the second dielectric layer and a portion of the first dielectric layer. A ditch exists in the passivation layer and the first dielectric layer. The spacer portion is located between the ditch and the seal ring structure.

According to an embodiment of the disclosure, the substrate may include a seal ring region and a scribe line region which are adjacent to each other.

According to an embodiment of the disclosure, the seal ring structure may be located in the seal ring region, and the ditch may be located in the scribe line region.

According to an embodiment of the disclosure, the ditch may expose a sidewall of the spacer portion.

According to an embodiment of the disclosure, a bottom surface of the ditch may be lower than a bottom surface of the spacer portion.

According to an embodiment of the disclosure, a bottom surface of the ditch may be lower than a bottom surface of the second interconnect structure.

According to an embodiment of the disclosure, the passivation layer may an opening therein, and the opening may expose the second interconnect structure.

According to an embodiment of the disclosure, the second interconnect structure may be further located on a top surface of the second dielectric layer.

According to an embodiment of the disclosure, the passivation layer may have a single-layer structure.

According to an embodiment of the disclosure, the passivation layer may have a multi-layer structure.

In an embodiment of the disclosure, a manufacturing method of a semiconductor structure include following steps. A substrate is provided. A first dielectric layer is formed on the substrate. A seal ring structure is formed. A method of forming the seal ring structure includes following steps. A first interconnect structure is formed in the first dielectric layer. A second dielectric layer is formed on the first interconnect structure and the first dielectric layer. A first opening and a first ditch are formed in the second dielectric layer. The first opening exposes the first interconnect structure, and the first ditch exposes the first dielectric layer. A second interconnect structure is formed in the first opening, and the second interconnect structure is connected to the first interconnect structure. A passivation layer is formed on the seal ring structure and the second dielectric layer and in the first ditch. A second ditch is formed. The second ditch passes through the passivation layer located in the first ditch and extends into the first dielectric layer below the first ditch.

According to another embodiment of the disclosure, the substrate may include a seal ring region and a scribe line region which are adjacent to each other.

According to another embodiment of the disclosure, the seal ring structure may be located in the seal ring region, and the second ditch may be located in the scribe line region.

According to another embodiment of the disclosure, the passivation layer may have a spacer portion, and the spacer portion may cover a sidewall of the second dielectric layer and a portion of the first dielectric layer.

According to another embodiment of the disclosure, the spacer portion may be located between the second ditch and the seal ring structure.

According to another embodiment of the disclosure, a width of the second ditch may be smaller than a width of the first ditch.

According to another embodiment of the disclosure, the first opening and the first ditch may be formed simultaneously.

According to another embodiment of the disclosure, a portion of the first dielectric layer may be removed while the second interconnect structure is being formed.

According to another embodiment of the disclosure, a bottom surface of the second ditch may be lower than a bottom surface of the second interconnect structure.

According to another embodiment of the disclosure, the manufacturing method of the semiconductor structure may further include following steps. A second opening is formed in the passivation layer. The second opening may expose the second interconnect structure, and the second opening and the second ditch may be formed simultaneously.

In view of the above, in the semiconductor structure provided in one or more embodiments of the disclosure, the spacer portion of the passivation layer covers the sidewall of the second dielectric layer and a portion of the first dielectric layer. That is, before the ditch is formed, a portion of the second dielectric layer may be removed, whereby the time and the power of the etching process for forming the ditch may be reduced. Besides, owing to the possibility of reducing the power of the etching process for forming the ditch, a negative impact of the etching process on semiconductor devices may be prevented.

Additionally, in the manufacturing method of the semiconductor structure provided in one or more embodiments of the disclosure, the first ditch is formed in the second dielectric layer, and then the second ditch is formed. Namely, before the second ditch is formed, a portion of the second dielectric layer is already removed, whereby the time and the power of the etching process for forming the second ditch may be reduced. Besides, owing to the possibility of reducing the power of the etching process for forming the second ditch, a negative impact of the etching process on semiconductor devices may be prevented.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

FIG. 1A to FIG. 1D are cross-sectional views of a manufacturing process of a semiconductor structure according to some embodiments of the disclosure. FIG. 2 is a cross-sectional view of a semiconductor structure according to other embodiments of the disclosure.

Figure 1A:
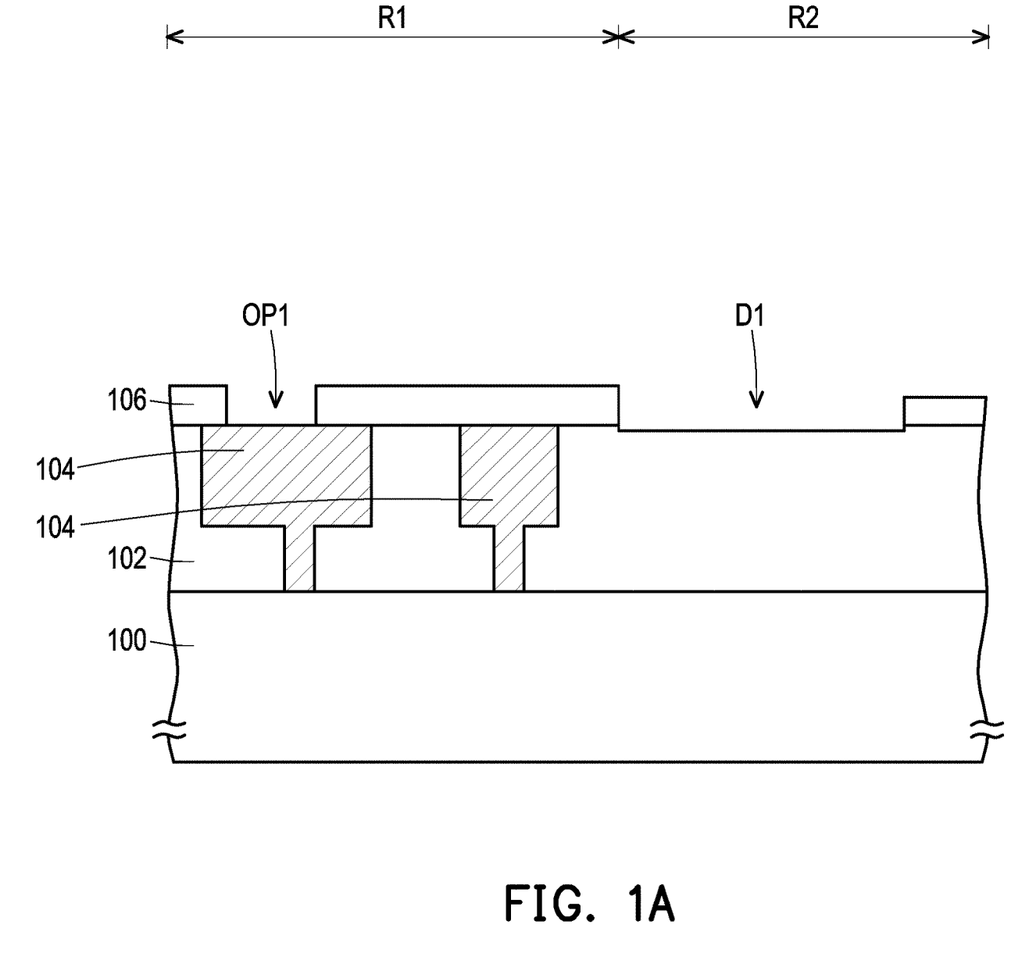
FIG. 1A to FIG. 1D are cross-sectional views of a manufacturing process of a semiconductor structure according to some embodiments of the disclosure.
Figure 2:
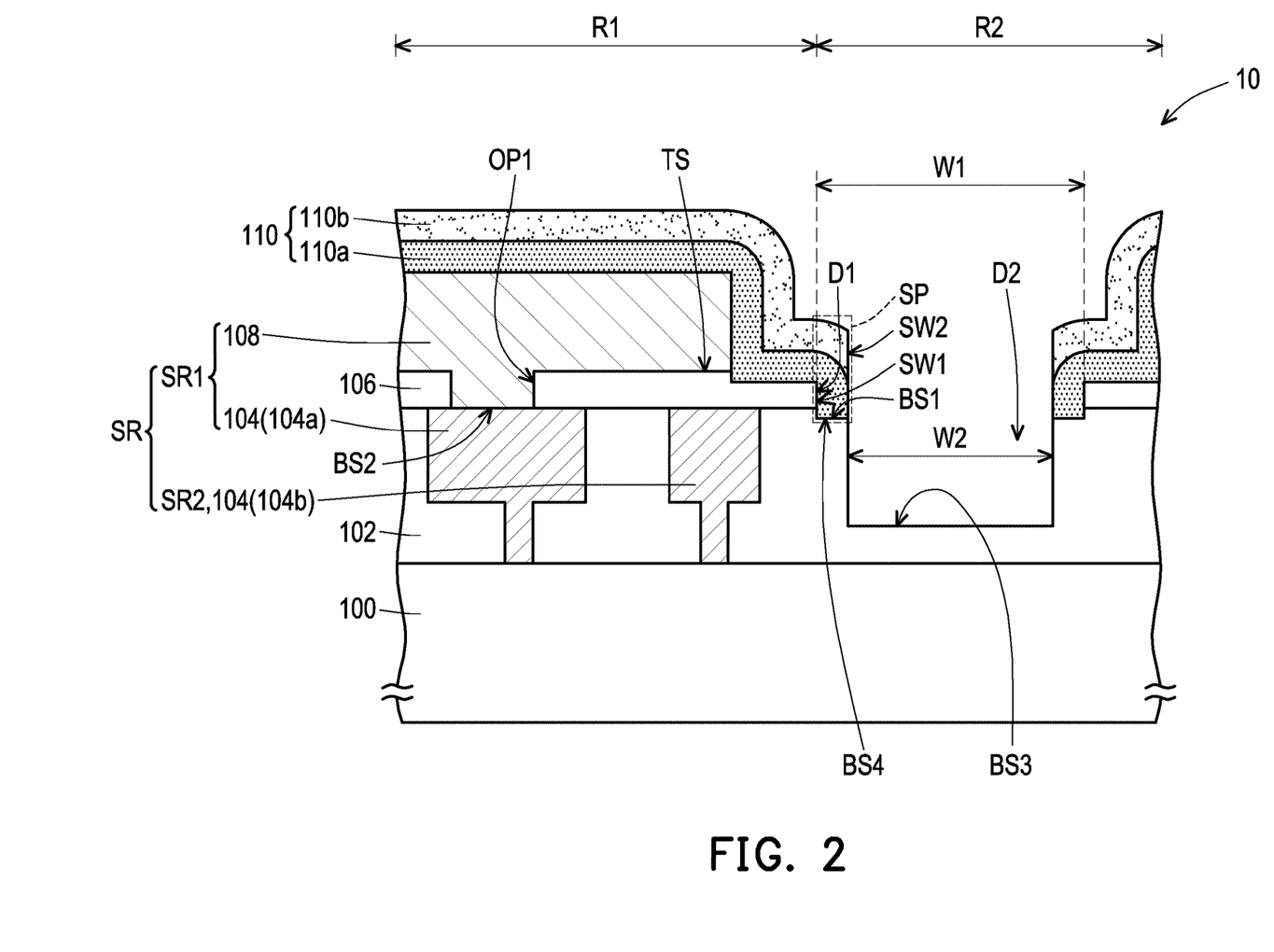
FIG. 2 is a cross-sectional view of a semiconductor structure according to other embodiments of the disclosure.

With reference to FIG. 1A, a substrate 100 is provided. The substrate 100 may include a seal ring region R1 and a scribe line region R2 that are adjacent to each other. The substrate 100 may be a semiconductor substrate, such as a silicon substrate. In addition, although not shown in FIG. 1A, the substrate 100 may have required components therein, such as doped regions and/or isolation structures, and the substrate 100 may have required components thereon, such as semiconductor devices (e.g., active devices and/or passive devices); the relevant descriptions of these components are omitted here.

A dielectric layer 102 is formed on the substrate 100. The dielectric layer 102 may have a single-layer structure or a multi-layer structure. A material of the dielectric layer 102 is, for instance, silicon oxide, silicon nitride, or a combination thereof. A method of forming the dielectric layer 102 is, for instance, chemical vapor deposition (CVD).

Figure 1B:
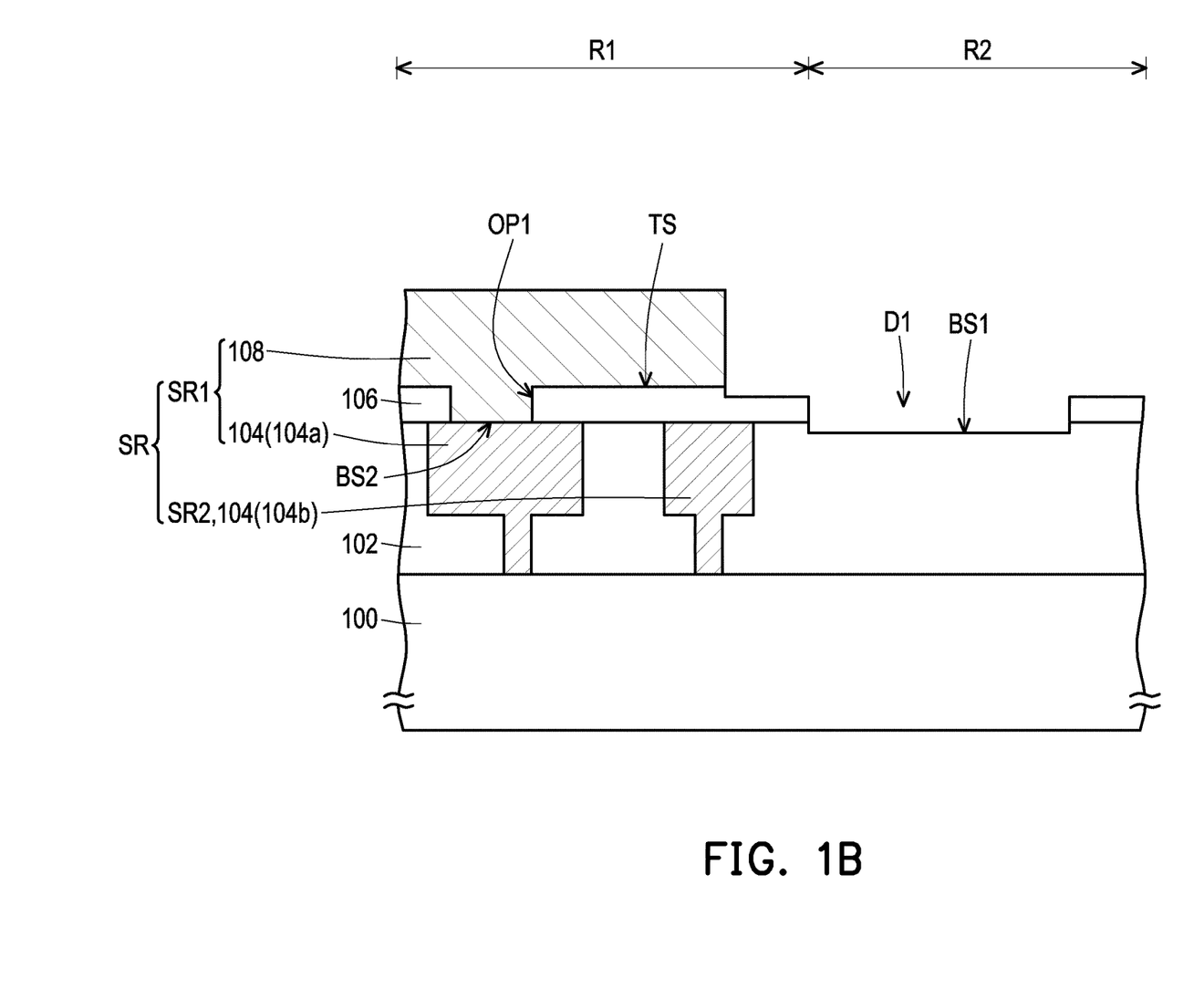

With reference to FIG. 1A and FIG. 1B, a seal ring structure SR (shown in FIG. 1B) is formed. In some embodiments, the seal ring structure SR may be a die seal ring structure. The seal ring structure SR may be located in the seal ring region R1. A method of forming the seal ring structure SR includes following steps. With reference to FIG. 1A, an interconnect structure 104 is formed in the dielectric layer 102. A material of the interconnect structure 104 is, for instance, metal, such as copper. The interconnect structure 104 may be formed by performing a metal interconnect process. The number of layers of the interconnect structure 104 is not limited to the number of layers shown in the drawings. Those having ordinary knowledge in the pertinent field may adjust the number of layers of the interconnect structure 104 according to actual requirements.

Next, a dielectric layer 106 is formed on the interconnect structure 104 and the dielectric layer 102. The dielectric layer 106 may have a single-layer structure or a multi-layer structure. A material of the dielectric layer 106 is, for instance, silicon oxide, silicon nitride, or a combination thereof. A method of forming the dielectric layer 106 is, for instance, CVD.

An opening OP1 and a ditch D1 are formed in the dielectric layer 106. The opening OP1 exposes the interconnect structure 104. The ditch D1 exposes the dielectric layer 102. The opening OP1 may be located in the seal ring region R1. The ditch D1 may be located in the scribe line region R2. A method of forming the opening OP1 and the ditch D1 is, for instance, patterning the dielectric layer 106 by performing a photolithography process and an etching process. In some embodiments, the opening OP1 and the ditch D1 may be formed simultaneously. In some embodiments, during the process of forming the opening OP1 and the ditch D1, a portion of the dielectric layer 102 may be removed.

With reference to FIG. 1B, an interconnect structure 108 is formed in the opening OP1. The interconnect structure 108 is connected to the interconnect structure 104. In some embodiments, the interconnect structure 108 may be further located on a top surface TS of the dielectric layer 106. In some embodiments, in a process of forming the interconnect structure 108, a portion of the dielectric layer 102 may be removed, whereby a bottom surface BS1 of the ditch D1 may be lower than a bottom surface BS2 of the interconnect structure 108. In some embodiments, during the process of forming the interconnect structure 108, a portion of the dielectric layer 106 may be removed. A material of the interconnect structure 108 is, for instance, aluminum and other metals. The interconnect structure 108 may be formed by applying a metal interconnect process. The interconnect structure 108 is not limited to the structure shown in the drawings. Those having ordinary knowledge in the pertinent field may adjust the interconnect structure 108 according to actual requirements.

Through applying the aforesaid method, the seal ring structure SR may be formed. The seal ring structure SR includes the interconnect structure 104 and the interconnect structure 108. In this embodiment, the seal ring structure SR may include a seal ring SR1 and a seal ring SR2. For instance, the seal ring SR1 may include an interconnect structure 104a and the interconnect structure 108, and the seal ring SR2 may include an interconnect structure 104b, which should however not be construed as a limitation in the disclosure. In this embodiment, the seal ring structure SR is exemplified by including a plurality of seal rings (e.g., the seal ring SR1 and the seal ring SR2), which should however not be construed as a limitation in the disclosure. As long as the seal ring structure SR includes at least one seal ring, it falls within the scope of protection provided in the disclosure.

Figure 1C:
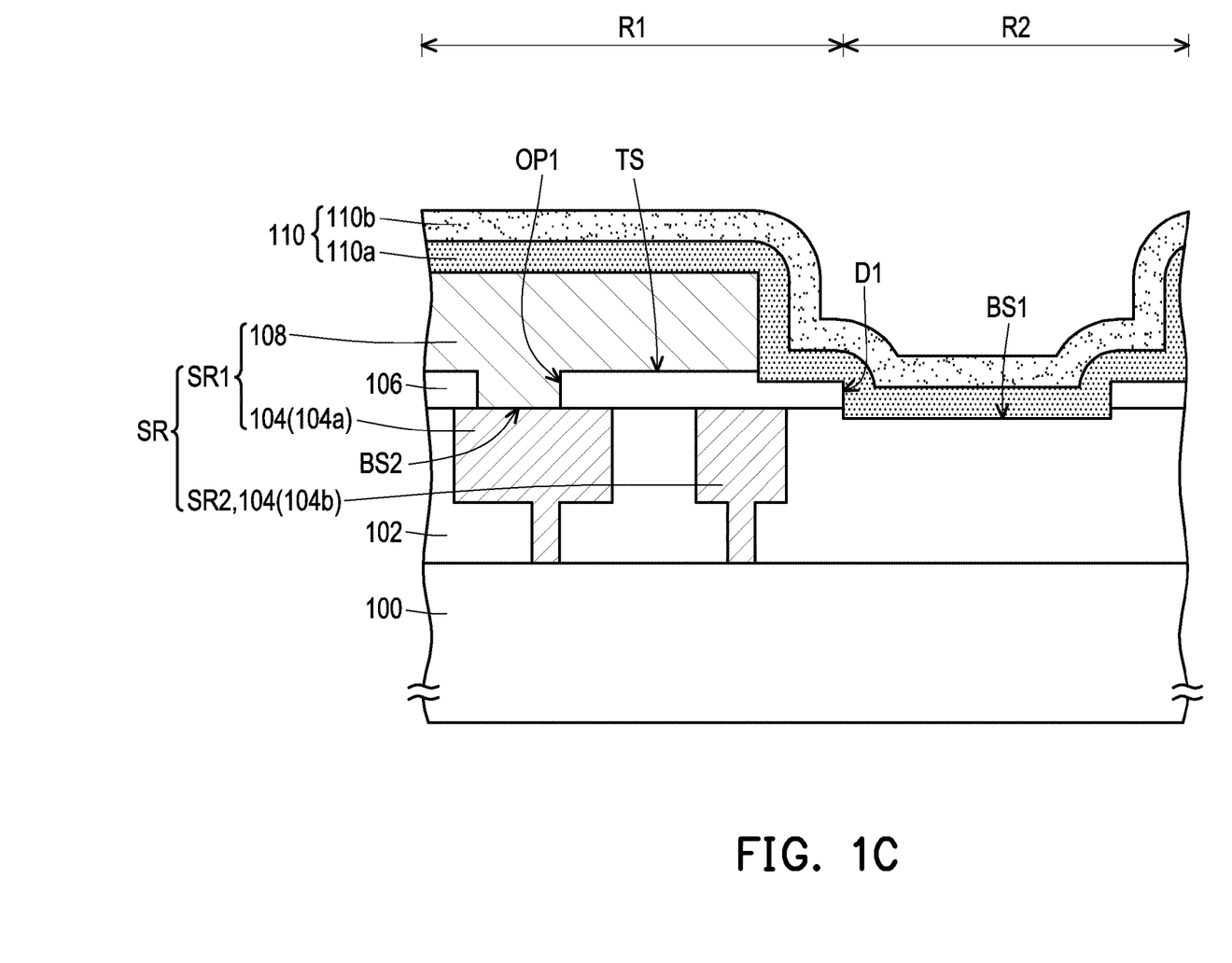

With reference to FIG. 1C, a passivation layer 110 is formed on the seal ring structure SR and the dielectric layer 106 and in the ditch D1. The passivation layer 110 may have a single-layer structure or a multi-layer structure. In this embodiment, the passivation layer 110 is exemplified by having the multi-layer structure, which should however not be construed as a limitation in the disclosure. For instance, the passivation layer 110 may include a passivation layer 110a and a passivation layer 110b. The passivation layer 110a is located on the seal ring structure SR and the dielectric layer 106 and in the ditch D1. A material of the passivation layer 110a is, for instance, silicon oxide. A method of forming the passivation layer 110a is, for instance, CVD. The passivation layer 110b is located on the passivation layer 110a. A material of the passivation layer 110b is, for instance, silicon nitride. A method of forming the passivation layer 110b is, for instance, CVD.

Figure 1D:
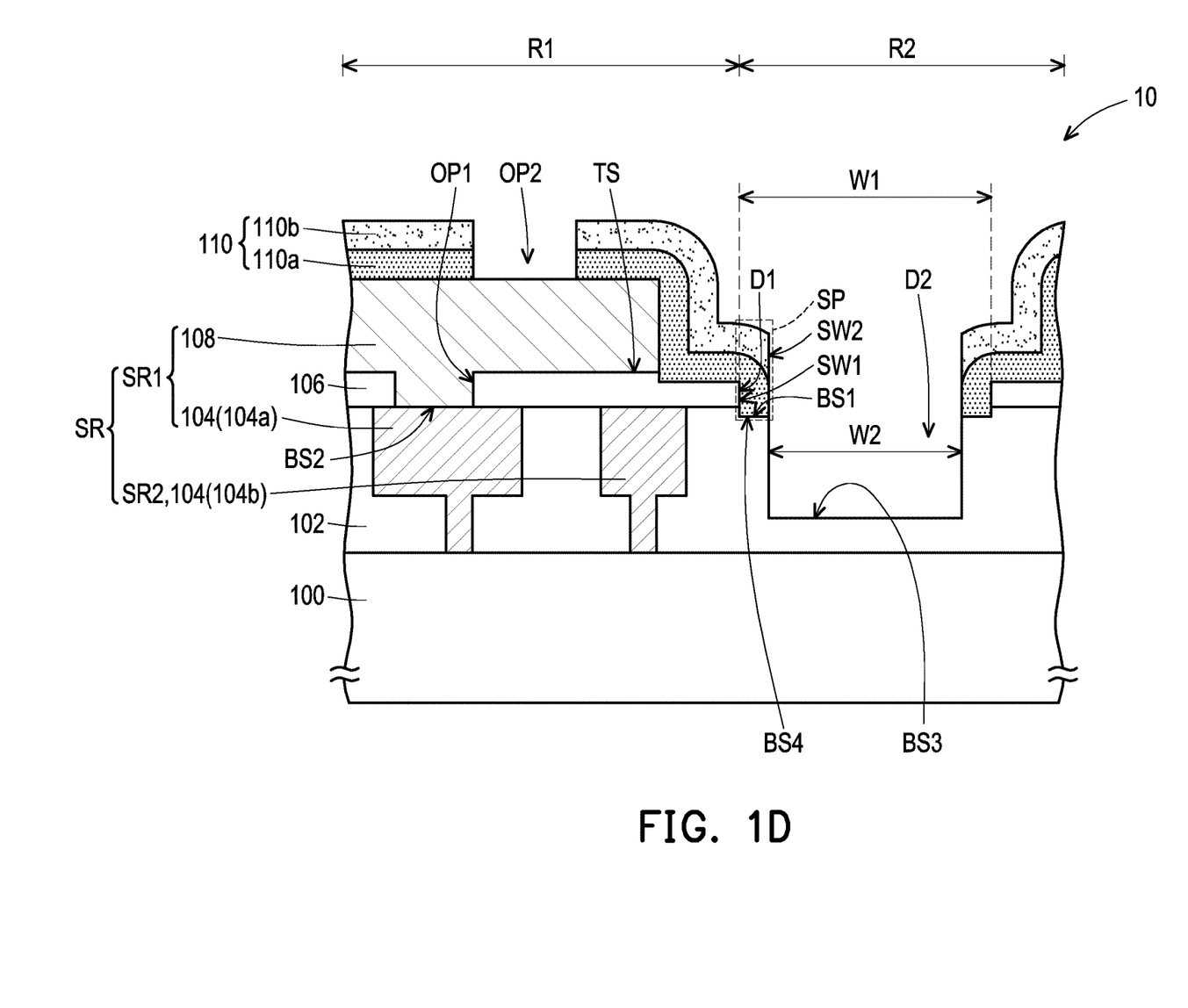

With reference to FIG. 1D, a ditch D2 is formed. The ditch D2 may be located in the scribe line region R2. A width W2 of the ditch D2 may be smaller than a width W1 of the ditch D1. A bottom surface BS3 of the ditch D2 may be lower than a bottom surface BS2 of the interconnect structure 108. A method of forming the ditch D2 is, for instance, patterning the passivation layer 110 and the dielectric layer 102 by performing a photolithography process and an etching process. In addition, an opening OP2 may be further formed in the passivation layer 110. The opening OP2 may be located in the seal ring region R1. The opening OP2 may expose the interconnect structure 108. A method of forming the opening OP2 is, for instance, patterning the passivation layer 110 by performing a photolithography process and an etching process. In some embodiments, the opening OP2 and the ditch D2 may be formed simultaneously.

The ditch D2 passes through the passivation layer 110 located in the ditch D1 and extends into the dielectric layer 102 below the ditch D1. The passivation layer 110 may have a spacer portion SP. The spacer portion SP may cover a sidewall SW1 of the dielectric layer 106 and a portion of the dielectric layer 102. The spacer portion SP may be located between the ditch D2 and the seal ring structure SR. A bottom surface BS4 of the spacer portion SP may be lower than the bottom surface BS2 of the interconnect structure 108. The ditch D2 may expose a sidewall SW2 of the spacer portion SP. The bottom surface BS3 of the ditch D2 may be lower than the bottom surface BS4 of the spacer portion SP.

According to the previous embodiments, in the manufacturing method of the semiconductor structure, the ditch D1 is formed in the dielectric layer 106, and then the ditch D2 is formed. Namely, before the ditch D2 is formed, a portion of the dielectric layer 106 is already removed, whereby the time and the power of the etching process for forming the ditch D2 may be reduced. Besides, owing to the possibility of reducing the power of the etching process for forming the ditch D2, a negative impact of the etching process on semiconductor devices may be prevented.

Hereinafter, the semiconductor structure 10 provided in the previous embodiment is described with reference to FIG. 1D. Besides, although the method of forming the semiconductor structure 10 is exemplified by the above-mentioned method, the exemplified method should however not be construed as a limitation in the disclosure.

With reference to FIG. 1D, the semiconductor structure 10 includes the substrate 100, the dielectric layer 102, the dielectric layer 106, the seal ring structure SR, and the passivation layer 110. The dielectric layer 102 is located on the substrate 100. The dielectric layer 106 is located on the dielectric layer 102. The seal ring structure SR includes the interconnect structure 104 and interconnect structure 108. The interconnect structure 104 is located in the dielectric layer 102. The interconnect structure 108 is located in the dielectric layer 106 and connected to the interconnect structure 104. The passivation layer 110 is located on the seal ring structure SR and the dielectric layer 106. The passivation layer 110 has the spacer portion SP. The spacer portion SP covers the sidewall SW1 of the dielectric layer 106 and a portion of the dielectric layer 102. The ditch D2 exists in the passivation layer 110 and the dielectric layer 102. The spacer portion SP is located between the ditch D2 and the seal ring structure SR. In this embodiment, the passivation layer 110 may have the opening OP2 which may expose the interconnect structure 108, which should however not be construed as a limitation in the disclosure. In another embodiment, as shown in FIG. 2, the opening OP2 in FIG. 1 may not be included in the passivation layer 110 in FIG. 2.

In addition, the detailed contents of each component in the semiconductor structure 10 (e.g., the material, the arrangement relationship, the forming method, the effects, etc.) have been elaborated in the previous embodiments and thus will not be repeated hereinafter.

As provided in the previous embodiments, in the semiconductor structure 10, the spacer portion SP of the passivation layer 110 covers the sidewall SW1 of the dielectric layer 106 and a portion of the dielectric layer 102. That is, before the ditch D2 is formed, a portion of the dielectric layer 106 may be removed, whereby the time and the power of the etching process for forming the ditch D2 may be reduced. Besides, owing to the possibility of reducing the power of the etching process for forming the ditch D2, the negative impact of the etching process on the semiconductor devices may be prevented.

To sum up, in the semiconductor structure and the manufacturing method thereof provided in one or more embodiments of the disclosure, the time and the power of the etching process for forming the ditch may be reduced. Besides, owing to the possibility of reducing the power of the etching process for forming the ditch, the negative impact of the etching process on the semiconductor devices may be prevented.

It will be apparent to those skilled in the art that various modifications and variations may be made to the disclosed embodiments without departing from the scope or spirit of the disclosure. In view of the foregoing, it is intended that the disclosure covers modifications and variations provided they fall within the scope of the following claims and their equivalents.

What is claimed is:
1. A semiconductor structure, comprising
a substrate;
a first dielectric layer, located on the substrate;
a second dielectric layer, located on the first dielectric layer;
a seal ring structure, comprising:
  a first interconnect structure, located in the first dielectric layer; and
  a second interconnect structure, located in the second dielectric layer and connected to the first interconnect structure; and
a passivation layer, located on the seal ring structure and the second dielectric layer and having a spacer portion, wherein the spacer portion covers a sidewall of the second dielectric layer and a portion of the first dielectric layer, and a ditch exists in the passivation layer and the first dielectric layer, wherein the spacer portion is located between the ditch and the seal ring structure.

2. The semiconductor structure according to claim 1, wherein the substrate comprises a seal ring region and a scribe line region adjacent to each other.

3. The semiconductor structure according to claim 2, wherein the seal ring structure is located in the seal ring region, and the ditch is located in the scribe line region.

4. The semiconductor structure according to claim 1, wherein the ditch exposes a sidewall of the spacer portion.

5. The semiconductor structure according to claim 1, wherein a bottom surface of the ditch is lower than a bottom surface of the spacer portion.

6. The semiconductor structure according to claim 1, wherein a bottom surface of the ditch is lower than a bottom surface of the second interconnect structure.

7. The semiconductor structure according to claim 1, wherein the passivation layer has an opening exposing the second interconnect structure.

8. The semiconductor structure according to claim 1, wherein the second interconnect structure is further located on a top surface of the second dielectric layer.

9. The semiconductor structure according to claim 1, wherein the passivation layer comprises a single-layer structure.

10. The semiconductor structure according to claim 1, wherein the passivation layer comprises a multi-layer structure.

* * * * *